United States Patent
Liang et al.

(10) Patent No.: US 8,564,583 B2
(45) Date of Patent: Oct. 22, 2013

(54) BIAS CIRCUIT FOR A COMPLEMENTARY CURRENT MODE LOGIC DRIVE CIRCUIT

(75) Inventors: Kevin Yikai Liang, Fremont, CA (US); Xin Liu, El Dorado Hill, CA (US); Arvind Bomdica, Fremont, CA (US); Ming-Ju Edward Lee, San Jose, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 907 days.

(21) Appl. No.: 12/640,180

(22) Filed: Dec. 17, 2009

(65) Prior Publication Data

US 2011/0148838 A1 Jun. 23, 2011

(51) Int. Cl.
*G06F 3/038* (2013.01)
(52) U.S. Cl.
USPC .............................. 345/211; 345/212; 327/535

(58) Field of Classification Search
USPC .................................. 345/211, 212; 327/535
See application file for complete search history.

(56) References Cited

U.S. PATENT DOCUMENTS

| | | | |
|---|---|---|---|
| 7,521,976 B1 * | 4/2009 | Sudjian et al. ............... | 327/199 |
| 8,212,749 B2 * | 7/2012 | Cho et al. ..................... | 345/82 |
| 2003/0030471 A1 * | 2/2003 | Wang ........................... | 327/115 |

* cited by examiner

*Primary Examiner* — Adam R Giesy
(74) *Attorney, Agent, or Firm* — Faegre Baker Daniels LLP

(57) ABSTRACT

A circuit includes a complementary current mode logic driver circuit and a dual feedback current mode logic bias circuit. The complementary current mode logic driver circuit provides a first output voltage and a second output voltage. The dual feedback current mode logic bias circuit includes a first feedback circuit and a second feedback circuit. The first feedback circuit provides a first bias voltage for the complementary current mode logic driver circuit in response to the first output voltage. The second feedback circuit provides a second bias voltage in response to the second output voltage.

20 Claims, 3 Drawing Sheets

BIAS CIRCUIT FOR A COMPLEMENTARY CURRENT MODE LOGIC DRIVE CIRCUIT

FIELD

The present disclosure generally relates to current mode logic bias circuits, and more particularly, to current mode logic bias circuits for a complementary current mode logic driver circuits.

BACKGROUND

Increasing processing speeds of devices such as graphics processors, hard disks, network cards, and other high speed I/O devices have created a need for an increased bandwidth for communicating between devices. One way to increase bandwidth between the bridge circuit and the I/O device is to use a differential communication link such as PCI Express™, HyperTransport™, SATA, USB, or other suitable differential communication links. Such interfaces are a flexible, hybrid serial-parallel interface format that uses multiple differential communication links often referred to as lanes. Each link includes transmit lanes to transmit information and receive lanes to receive information.

A transmitter circuit is typically coupled to one or more of the transmit lanes to transmit information over the transmit lane(s). In order to reduce power consumption, complementary current mode logic (CML) drivers can be used in transmitter circuits rather than conventional uni-polar CML drivers. For example, a complementary CML driver will typically consume approximately 12 mA of current in order provide a 1.2V differential swing via a transmit lane. Conversely, a uni-polar CML driver will typically consume approximately 24 mA of current (i.e., approximately twice as much as the complementary CML driver). However, due to the bi-polar current sources used in complementary CML drivers, current calibration and biasing can be difficult due to dual bias loops.

One known method to bias a complementary CML driver is to use a current mirror circuit to copy a calibrated current to the bi-polar current sources of the complementary CML driver. However, this method requires a substantial number of circuit components, which increases the size of the circuit and additionally increases power consumption of the complementary CML driver. In addition, this method can have a current mismatch of 30-40%, which is undesirable.

Accordingly, a need exists for a current biasing circuit for a complementary CML driver that requires less components, consumes less power than known biasing circuits, and has an improved current mismatch.

BRIEF DESCRIPTION OF THE DRAWINGS

The invention will be more readily understood in view of the following description when accompanied by the below figures, wherein like reference numerals represent like elements.

DETAILED DESCRIPTION

Figure 1:
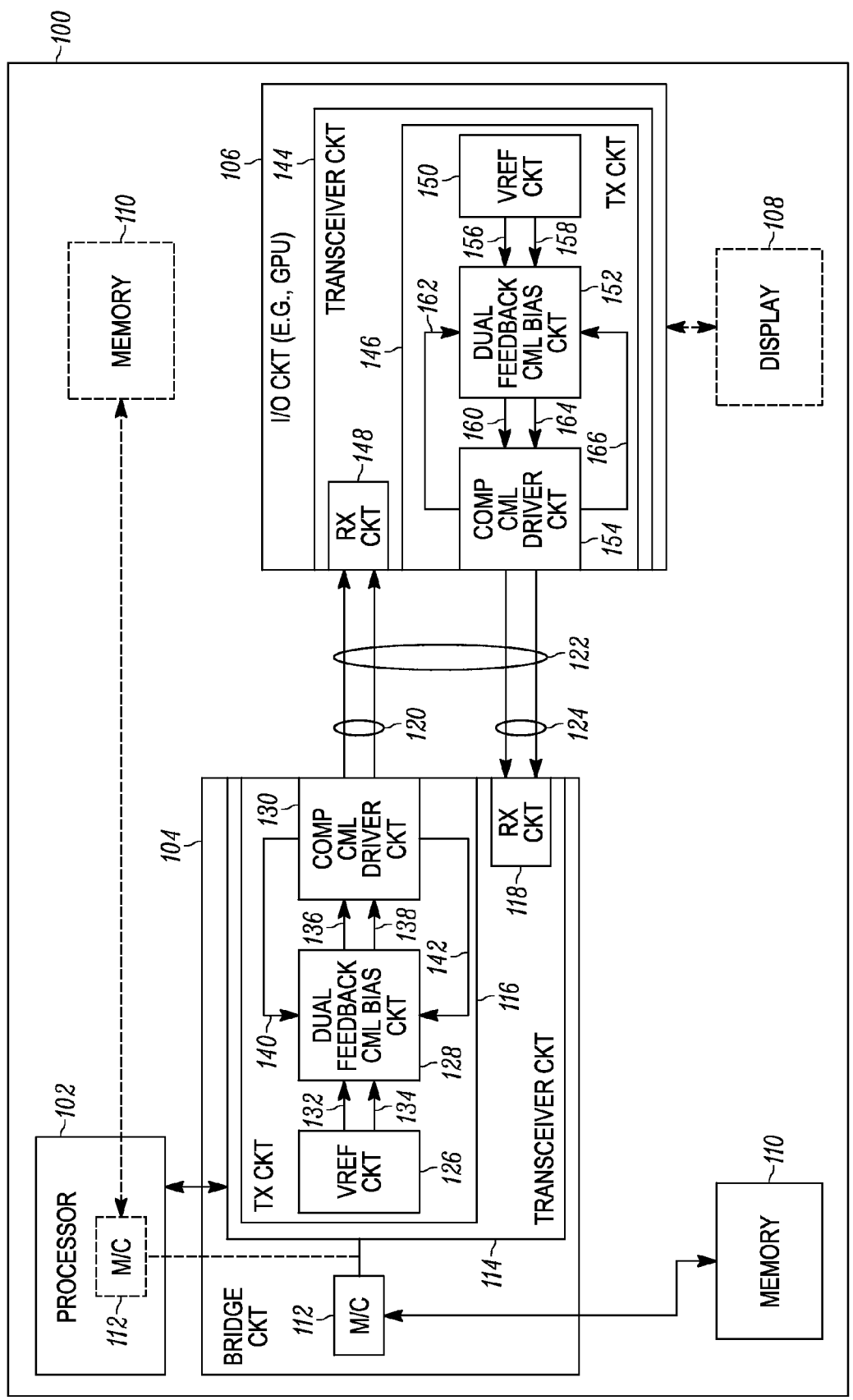
FIG. 1 is an exemplary functional block diagram of a device having a dual feedback current mode logic (CML) bias circuit that biases a complementary CML driver circuit.

In one example, a circuit includes a complementary current mode logic driver circuit and a dual feedback current mode logic bias circuit. The complementary current mode logic driver circuit provides a first output voltage and a second output voltage. The dual feedback current mode logic bias circuit includes a first feedback circuit and a second feedback circuit. The first feedback circuit provides a first bias voltage for the complementary current mode logic driver circuit in response to the first output voltage. The second feedback circuit provides a second bias voltage in response to the second output voltage.

The circuit, among other advantages, requires less components than known current mode bias circuits, which reduces the overall size of the circuit. In addition, due to the reduced number of components, the circuit also consumes less power than conventional current mode bias circuits. Furthermore, the circuit exhibits an improved current mismatch than conventional circuits. Other advantages will be recognized by those of ordinary skill in the art.

In one example, the first feedback circuit has a first bandwidth and the second feedback circuit has a second bandwidth that is less than the first bandwidth.

In one example, the first feedback circuit includes a first differential amplifier circuit. The first differential amplifier circuit provides the first bias voltage in response to the first output voltage. The second feedback circuit includes a second differential amplifier circuit. The second differential amplifier circuit provides the second bias voltage in response to the second output voltage. In one example, first differential amplifier circuit has a first bandwidth and the second differential amplifier circuit has a second bandwidth that is less than the first bandwidth.

In one example, the circuit includes a voltage reference circuit. The voltage reference circuit provides a first reference voltage and a second reference voltage. The first feedback circuit provides the first bias voltage based on the first reference voltage. The second feedback provides the second bias voltage based on the second reference voltage.

In one example, the first feedback circuit includes a first filter circuit having a first pole. The first filter circuit provides the first bias voltage in response to the first output voltage. The second feedback circuit includes a second filter circuit having a second pole. The second filter circuit provides the second bias voltage in response to the second output voltage.

In one example, the complementary current mode logic driver circuit provides a differential voltage based on the first bias voltage and the second bias voltage. The first output voltage corresponds to a first voltage of the differential voltage or a common mode voltage of the complementary current mode logic driver circuit. The second output voltage corresponds to a second voltage of the differential voltage or the common mode voltage of the complementary current mode logic driver circuit.

In one example, a device includes the circuit and a display. The display displays an image based on the first output voltage and the second output voltage.

In one example, a computer readable medium comprises information that when executed by a processor causes the processor to operate, design, and/or organize the circuit. In one example, the information comprises data representing hardware description language.

As used herein, the term "circuit" can include an electronic circuit, one or more processors (e.g., shared, dedicated, or group of processors such as but not limited to microprocessors, DSPs, or central processing units) and memory that execute one or more software or firmware programs, combinational logic circuits, an ASIC, and/or other suitable components that provide the described functionality. Additionally, as will be appreciated by those of ordinary skill in the art, the operation, design, and organization, of a "circuit" can be described in a hardware description language such as Verilog™, VHDL, or other suitable hardware description languages.

Referring now to FIG. 1, an exemplary functional block diagram of a device 100 such as a wireless phone, a mobile and/or stationary computer, a printer, a LAN interface (wireless and/or wired), a media player, a video decoder and/or encoder, and/or any other suitable digital device is depicted. The device 100 includes at least one processor circuit 102, a bridge circuit 104, a high speed I/O circuit 106 such as a graphics processor circuit (or core) and associated display 108, and a memory circuit 110.

The processor circuit 102 is operatively coupled to the bridge circuit 104 and processes requests from the bridge circuit 104. In some embodiments, the bridge circuit 104 includes a memory controller circuit 112 that is operatively coupled to the memory circuit 110. The memory circuit 110 stores information communicated from the bridge circuit 104. In other embodiments, the processor circuit 102 includes the memory controller circuit 212 that is operatively coupled to the memory circuit 112, which stores information communicated from the processor circuit 102.

The bridge circuit 104 includes a first transceiver circuit 114. The first transceiver circuit 114 includes a first transmitter circuit 116 and a first receiver circuit 118. The first transmitter circuit 116 transmits information via a first differential communication path 120 of a differential communication link 122. The receiver circuit 118 receives information via a second differential communication path 124. The differential communication link 122 can be any suitable differential communication link such as, but not limited to, PCI Express™, HyperTransport™, SATA, USB, and other suitable differential communication links.

The first transmitter circuit 116 includes a first voltage reference circuit 126, a first dual feedback current mode logic (CML) bias circuit 128, and a first complementary CML driver circuit 130. The first voltage reference circuit 126 provides a first reference voltage 132 and a second reference voltage 134. The first voltage reference circuit 126 can be any suitable voltage reference circuit such as, for example, a voltage divider circuit. In this example, the first reference voltage 132 corresponds to a high voltage of the differential voltage transmitted across the first differential communication path 120 and the second reference voltage 134 corresponds to a low voltage of the differential voltage transmitted across the first differential communication path 120.

The first dual feedback CML bias circuit 128 provides a first bias voltage 136 based on the first reference voltage 132 and a first output voltage 140 of the first complementary CML driver circuit 130. In addition, the first dual feedback CML bias circuit 128 provides a second bias voltage 138 based on the second reference voltage 134 and a second output voltage 142 of the first complementary CML driver circuit 130. The first bias voltage 136 and the second bias voltage 138 are used to bias bi-directional current sources of the first complementary CML driver circuit 130 in order to provide a differential voltage across the differential communication path 120. Furthermore, as will be discussed in more detail, the first output voltage 140 and second output voltage 142 are feedback voltages that are related to the differential voltage transmitted across the differential communication path 120.

The high speed I/O circuit 106 includes a second transceiver circuit 144. The second transceiver circuit 144 includes a second transmitter circuit 146 and a second receiver circuit 148. The second transmitter circuit 146 transmits information via the second differential communication path 124 of the differential communication link 122. The second receiver circuit 148 receives information via the first differential communication path 120.

The second transmitter circuit 146 includes a second voltage reference circuit 150, a second dual feedback CML bias circuit 152, and a second complementary CML driver circuit 154. The second voltage reference circuit 150 provides a third reference voltage 156 and a fourth reference voltage 158. The second voltage reference circuit 150 can be any suitable voltage reference circuit such as, for example, a voltage divider circuit. In this example, the third reference voltage 156 corresponds to a high voltage of the differential voltage transmitted across the first differential communication path 120 and the fourth reference voltage 158 corresponds to a low voltage of the differential voltage transmitted across the first differential communication path 120.

The second dual feedback CML bias circuit 152 provides a third bias voltage 160 based on the third reference voltage 156 and a third output voltage 162 of the second complementary CML driver circuit 154. In addition, the second dual feedback CML bias circuit 152 provides a fourth bias voltage 164 based on the fourth reference voltage 158 and a fourth output voltage 166 of the second complementary CML driver circuit 154. The third bias voltage 160 and the fourth bias voltage 164 are used to bias bi-directional current sources of the second complementary CML driver circuit 154 in order to provide a differential voltage across the differential communication path 124. Furthermore, as will be discussed in more detail, the third output voltage 162 and second output voltage 166 are feedback voltages that are related to the differential voltage transmitted across the differential communication path 124.

Figure 2:
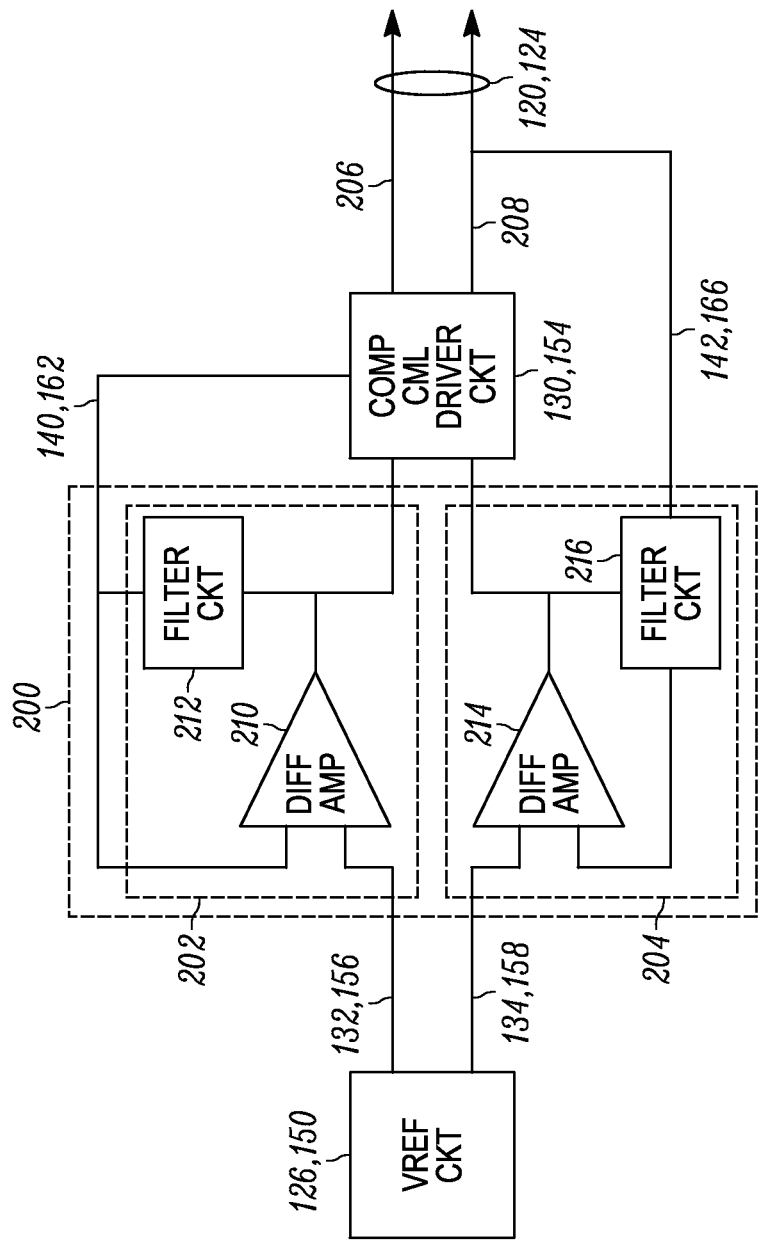
FIG. 2 is an exemplary diagram of the dual feedback CML bias circuit.

Referring now to FIG. 2, an exemplary diagram of the first and second dual feedback CML bias circuits 128, 152 hereinafter referred to as dual feedback CML bias circuit 200 is depicted. The dual feedback CML bias circuit 200 includes a first feedback circuit 202 and a second feedback circuit 204. In this example, the first feedback circuit 202 has a higher bandwidth than the second feedback circuit 204 or vice versa.

During operation, the first feedback circuit 202 (e.g., when it has the higher bandwidth) stabilizes first to provide the first bias voltage 132 and thereafter the second feedback circuit 204 stabilizes to provide the second bias voltage 134. As such, the first bias voltage 132 and second bias voltage 134 are dependent on each other.

More specifically, the first feedback circuit 202 provides the first bias voltage 132 in response to the first output voltage 128. In this example, the first output voltage 128 corresponds to a common mode voltage of the dual mode feedback CML bias circuit 200. In other embodiments, the first output voltage 128 can correspond to the a first voltage 206 of a differential voltage transmitted across the differential communication path 120, 124.

The second feedback circuit 204 provides the second bias voltage 134 in response to the second output voltage 142. In this example, the second output voltage 142 corresponds with a second voltage 208 of the differential voltage transmitted across the differential communication path 120, 124. In other embodiments, the second output voltage 142 can correspond to the common mode voltage of the dual mode feedback CML bias circuit 200.

The first feedback circuit 202 includes a first differential amplifier circuit 210 and a first filter circuit 212. The first differential amplifier circuit 210 is operatively coupled provide the bias voltage 136, 160 in response to the feedback voltage 128, 146 and the reference voltage 132, 156. The first filter circuit 212 is operatively coupled between the feedback voltage 128, 146 and the bias voltage 136, 160.

The first differential amplifier circuit 210 can be any suitable differential amplifier circuit. In one embodiment, the first differential amplifier circuit 210 has a unity gain, although other values are contemplated.

The first filter circuit 212 is a complex filter circuit having at least one pole to improve stability of the dual mode feedback CML bias circuit 200. The first filter circuit 212 can be any suitable complex filter circuit having at least one pole such as, for example, an RC filter circuit.

The second feedback circuit 204 includes a second differential amplifier circuit 214 and a second filter circuit 216. The second differential amplifier circuit 214 is operatively coupled provide the bias voltage 138, 158 in response to the feedback voltage 142, 166 and the reference voltage 134, 158. The second filter circuit 214 is operatively coupled between the feedback voltage 142, 166 and the bias voltage 138, 158.

The second differential amplifier circuit 214 can be any suitable differential amplifier circuit. In one embodiment, the second differential amplifier circuit 214 has a unity gain, although other values are contemplated.

The second filter circuit 216 is a complex filter circuit having at least one pole to improve stability of the dual mode feedback CML bias circuit 200. The second filter circuit 216 can be any suitable complex filter circuit having at least one pole such as, for example, an RC filter circuit.

Figure 3:
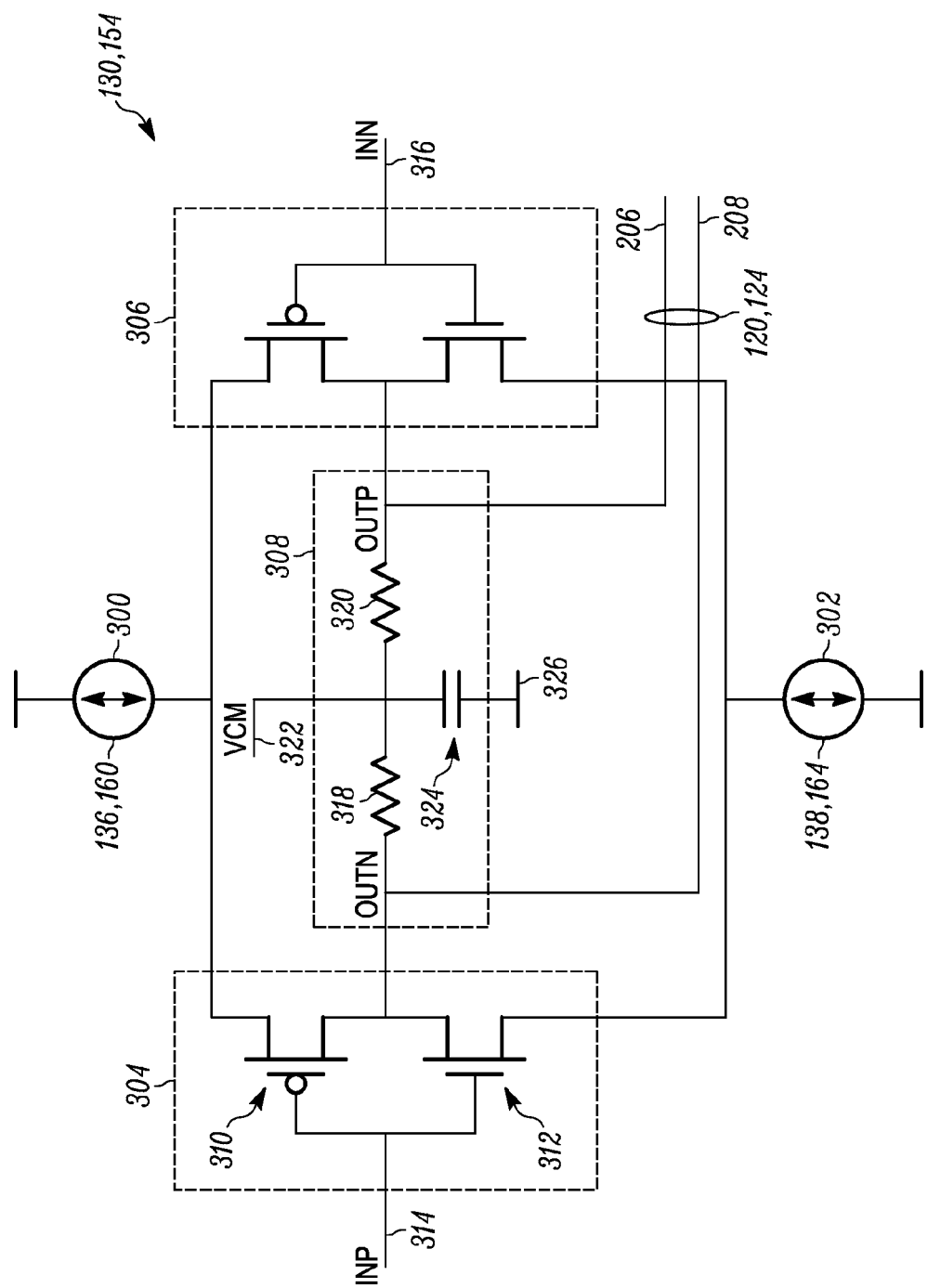
FIG. 3 is an exemplary diagram of the complementary CML driver circuit.

Referring now to FIG. 3, an exemplary diagram of the complementary CML driver circuit 130, 154 is depicted. The complementary CML driver circuit 130, 154 includes a first bidirectional current source 300, a second bidirectional current source 302, a first leg 304, and a second leg 306. In addition, in embodiments that where at least one of the feedback voltages 140, 142, 162, 166 corresponds to the common mode voltage, the complementary CML driver circuit 130, 154 can also include a termination leg 308.

The first and second bidirectional current sources 300, 302 can be any suitable bidirectional current source that is biased by a voltage such as bias voltages 136, 138, 160, 164.

In this example, the first and second legs 304, 306 each comprise a complementary metal oxide semiconductor (CMOS) inverter circuit. More specifically, the first leg 304 includes a first transistor 310 (e.g., PMOS) and a second transistor 312 (e.g., NMOS) configured as substantially shown. The first leg 304 provides the first voltage 206 of a differential voltage transmitted across the differential communication path 120, 124 in response to a first input voltage 314. Similarly, the second leg 306 provides the second voltage 208 of the differential voltage transmitted across the differential communication path 120, 124 in response to a second input voltage 316.

The termination leg 308 includes a first impedance 318 and a second impedance 320. The first and second impedance 318, 320 have substantially equal impedance values to provide an average or common mode voltage via terminal 322. In one embodiment, the impedance values can be 50 Ohms although other impedance values are contemplated. In addition, in some embodiments, the termination leg 308 can also include a third impedance 324, such as a capacitance, to improve isolation from a voltage source (or ground) if desired. As such, in some embodiments, the third impedance 324 can be 50 Ohms although other values are contemplated.

As noted above, among other advantages, the dual feedback CML bias circuit 200 requires less components than known current mode bias circuits, which reduces the overall size of the circuit. In addition, due to the reduced number of components, the dual feedback CML bias circuit 200 also consumes less power than conventional current mode bias circuits. Furthermore, the dual feedback CML bias circuit 200 exhibits an improved current mismatch than conventional circuits. Other advantages will be recognized by those of ordinary skill in the art.

Although the disclosure is described herein with reference to specific embodiments, various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims. In addition, unless stated otherwise, terms such as "first" and "second" are used to arbitrarily distinguish between the elements such terms describe. Thus, these terms are not necessarily intended to indicate temporal or other prioritization of such elements. The term coupled, as used herein, is defined as connected, although not necessarily directly, and not necessarily mechanically. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The terms a or an, as used herein, are defined as one or more than one.

What is claimed is:

1. A circuit comprising:
a complementary current mode logic driver circuit that is operative to provide a first output voltage and a second output voltage; and
a dual feedback current mode logic bias circuit comprising:
a first feedback circuit that is operative to provide a first bias voltage for the complementary current mode logic driver circuit in response to the first output voltage; and
a second feedback circuit that is operative to provide a second bias voltage for the complementary current mode logic driver circuit in response to the second output voltage.

2. The circuit of claim 1 wherein the first feedback circuit has a first bandwidth and the second feedback circuit has a second bandwidth that is less than the first bandwidth.

3. The circuit of claim 1 wherein:
the first feedback circuit comprises a first differential amplifier circuit that is operative to provide the first bias voltage in response to the first output voltage; and
the second feedback circuit comprises a second differential amplifier circuit that is operative to provide the second bias voltage in response to the second output voltage.

4. The circuit of claim 3 wherein the first differential amplifier circuit has a first bandwidth and the second differential amplifier circuit has a second bandwidth that is less than the first bandwidth.

5. The circuit of claim 1 further comprising a voltage reference circuit that is operative to provide a first reference voltage and a second reference voltage, wherein the first feedback circuit that is operative to provide the first bias voltage based on the first reference voltage and the second feedback circuit is operative to provide the second bias voltage based on the second reference voltage.

6. The circuit of claim 1 wherein:
- the first feedback circuit comprises a first filter circuit, having a first pole, that is operative provide the first bias voltage in response to the first output voltage; and
- the second feedback circuit comprises a second filter circuit, having a second pole, that is operative provide the second bias voltage in response to the second output voltage.

7. The circuit of claim 1 wherein the complementary current mode logic driver circuit is operative to provide a differential voltage based on the first bias voltage and the second bias voltage.

8. The circuit of claim 7 wherein:
- the first output voltage corresponds to one of a first voltage of the differential voltage and a common mode voltage of the complementary current mode logic driver circuit; and
- the second output voltage corresponds to one of a second voltage of the differential voltage and the common mode voltage of the complementary current mode logic driver circuit.

9. A device comprising:
- a complementary current mode logic driver circuit that is operative to provide a first output voltage and a second output voltage;
- a dual feedback current mode logic bias circuit comprising:
  - a first feedback circuit that is operative to provide a first bias voltage for the complementary current mode logic driver circuit in response to the first output voltage; and
  - a second feedback circuit that is operative to provide a second bias voltage for the complementary current mode logic driver circuit in response to the second output voltage; and
- a display that is operative to display an image based on the first output voltage and the second output voltage.

10. The device of claim 9 wherein the first feedback circuit has a first bandwidth and the second feedback circuit has a second bandwidth that is less than the first bandwidth.

11. The device of claim 9 wherein:
- the first feedback circuit comprises a first differential amplifier circuit that is operative to provide the first bias voltage in response to the first output voltage; and
- the second feedback circuit comprises a second differential amplifier circuit that is operative to provide the second bias voltage in response to the second output voltage.

12. The device of claim 11 wherein the first differential amplifier circuit has a first bandwidth and the second differential amplifier circuit has a second bandwidth that is less than the first bandwidth.

13. The device of claim 9 further comprising a voltage reference circuit that is operative to provide a first reference voltage and a second reference voltage, wherein the first feedback circuit that is operative to provide the first bias voltage based on the first reference voltage and the second feedback circuit is operative to provide the second bias voltage based on the second reference voltage.

14. The device of claim 9 wherein:
- the first feedback circuit comprises a first filter circuit, having a first pole, that is operative provide the first bias voltage in response to the first output voltage; and
- the second feedback circuit comprises a second filter circuit, having a second pole, that is operative provide the second bias voltage in response to the second output voltage.

15. The device of claim 9 wherein the complementary current mode logic driver circuit is operative to provide a differential voltage based on the first bias voltage and the second bias voltage.

16. The device of claim 15 wherein:
- the first output voltage corresponds to one of a first voltage of the differential voltage and a common mode voltage of the complementary current mode logic driver circuit; and
- the second output voltage corresponds to one of a second voltage of the differential voltage and the common mode voltage of the complementary current mode logic driver circuit.

17. A non-transitory computer readable medium comprising information that when executed by at least one processor causes the at least one processor to:
- at least one of: operate, design, and organize a circuit that comprises:
  - a complementary current mode logic driver circuit that is operative to provide a first output voltage and a second output voltage; and
  - a dual feedback current mode logic bias circuit comprising:
    - a first feedback circuit that is operative to provide a first bias voltage for the complementary current mode logic driver circuit in response to the first output voltage; and
    - a second feedback circuit that is operative to provide a second bias voltage for the complementary current mode logic driver circuit in response to the second output voltage.

18. The computer readable medium of claim 17 wherein the first feedback circuit has a first bandwidth and the second feedback circuit has a second bandwidth that is less than the first bandwidth.

19. The computer readable medium of claim 17 wherein:
- the first feedback circuit comprises a first differential amplifier circuit that is operative to provide the first bias voltage in response to the first output voltage; and
- the second feedback circuit comprises a second differential amplifier circuit that is operative to provide the second bias voltage in response to the second output voltage.

20. The computer readable medium of claim 17 wherein the information comprises data representing hardware description language.

* * * * *